United States Patent
Pan et al.

[11] Patent Number: 6,093,953
[45] Date of Patent: *Jul. 25, 2000

[54] ISOLATION REGIONS AND METHODS OF FORMING ISOLATION REGIONS

[75] Inventors: Pai-Hung Pan; Karl M. Robinson, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/069,230

[22] Filed: Apr. 28, 1998

Related U.S. Application Data

[60] Continuation of application No. 08/820,711, Aug. 18, 1997, Pat. No. 5,763,932, which is a division of application No. 08/745,716, Nov. 12, 1996, Pat. No. 5,834,358.

[51] Int. Cl.[7] ..................................................... H01L 29/00
[52] U.S. Cl. .......................... 257/510; 257/518; 257/513
[58] Field of Search ..................................... 257/510, 523, 257/524, 513, 518, 527

[56] References Cited

U.S. PATENT DOCUMENTS

| | | | |
|---|---|---|---|
| Re. 34,400 | 10/1993 | Goto et al. | 437/67 |
| 4,509,249 | 4/1985 | Goto et al. | 29/576 W |
| 4,661,832 | 4/1987 | Lechaton et al. | 357/49 |
| 4,729,006 | 3/1988 | Daily et al. | 357/42 |
| 4,758,531 | 7/1988 | Beyer et al. | 437/90 |
| 4,789,883 | 12/1988 | Cox et al. | 357/23.7 |
| 4,845,051 | 4/1989 | Cogan et al. | 437/203 |
| 4,980,306 | 12/1990 | Shimbo | 437/34 |
| 4,985,368 | 1/1991 | Ishii et al. | 437/38 |
| 5,051,795 | 9/1991 | Gill | 257/510 |
| 5,137,837 | 8/1992 | Chang et al. | 437/21 |
| 5,192,706 | 3/1993 | Rodder | 437/67 |
| 5,234,861 | 8/1993 | Roisen et al. | 437/67 |
| 5,270,244 | 12/1993 | Baliga | 437/67 |

(List continued on next page.)

OTHER PUBLICATIONS

Davari, B., et. al., "A Variable–Size Shallow Trench Isolation (STI) Technology with Diffused Sidewall Doping for Submicron CMOS", IEDM 1988, pp. 92–95.

Blumenstock, K., "Shallow Trench Isolation for Ultra–Large–Scale Integrated Devices", J. Vac. Sci. Technol. B vol. 12, No. 1, Jan./Feb. 1994, pp. 54–58.

Geissler, S., et al., "A New Three–Dimensional MOSFET Gate–Induced Drain Leakage Effect in Narrow Deep Submicron Devices", IEDM 1991, pp. 839–842.

Fuse, G., et. al., "A Practical Trench Isolation Technology with a Novel Planarization Process", IEDM 1987, pp. 732–735.

(List continued on next page.)

*Primary Examiner*—Sheila V. Clark
*Attorney, Agent, or Firm*—Wells, St. John, Roberts, Gregory & Matkin P.S.

[57] ABSTRACT

A silicon-comprising layer is employed adjacent a trench during planarization of an oxide fill within the trench. An overhanging oxide sidewall is formed along a lateral edge of a trenched isolation region, the overhanging oxide sidewall overlapping an upper surface of a substrate immediately adjacent the trenched isolation region. An oxide plug is formed comprising a recessed portion below a substrate upper surface and an elevated portion above the substrate upper surface. The elevated portion comprising a ledge which extends over the substrate upper surface and has a top surface and a substantially vertical lateral edge side surface. Further, the plug may be within a substrate, the oxide plug having a recessed portion below a substrate upper surface and an elevated portion above the substrate upper surface, the elevated portion comprising a ledge extending over the substrate upper surface and abutting a polysilicon layer.

6 Claims, 7 Drawing Sheets

U.S. PATENT DOCUMENTS

| | | | |
|---|---|---|---|
| 5,376,593 | 12/1994 | Sandhu et al. | 437/242 |
| 5,384,280 | 1/1995 | Aoki et al. | 437/67 |
| 5,387,540 | 2/1995 | Poon et al. | 437/67 |
| 5,424,240 | 6/1995 | Han | 437/67 |
| 5,433,794 | 7/1995 | Fazan et al. | 148/33.3 |
| 5,457,339 | 10/1995 | Komori et al. | 437/67 |
| 5,578,518 | 11/1996 | Koike et al. | 437/67 |
| 5,604,149 | 2/1997 | Paoli et al. | 437/67 |
| 5,763,932 | 6/1998 | Pan et al. | |
| 5,834,358 | 11/1998 | Pan et al. | |

OTHER PUBLICATIONS

Davari, B., et. al., "A New Planarization Technique, Using a Combination of RIE and Chemical Mechanical Polish (CMP)", IEDM 1989, pp. 61–64.

Shibata, T., et. al., "A Simplified Box (Buried–Oxide) Isolation Technology for Megabit Dynamic Memories", IEDM 1983, pp. 27–30.

Fuse, G., et. al., "Trench Isolation with Boron Implanted Side–Walls for Controlling Narrow–Width Effect of N–MOS Threshold Voltages", unknown source, pp. 58–59.

Akers, Lex A., "The Inverse–Narrow–Width Effect", IEDL Jul. 1986, vol. 7, No. 7, pp. 419–421.

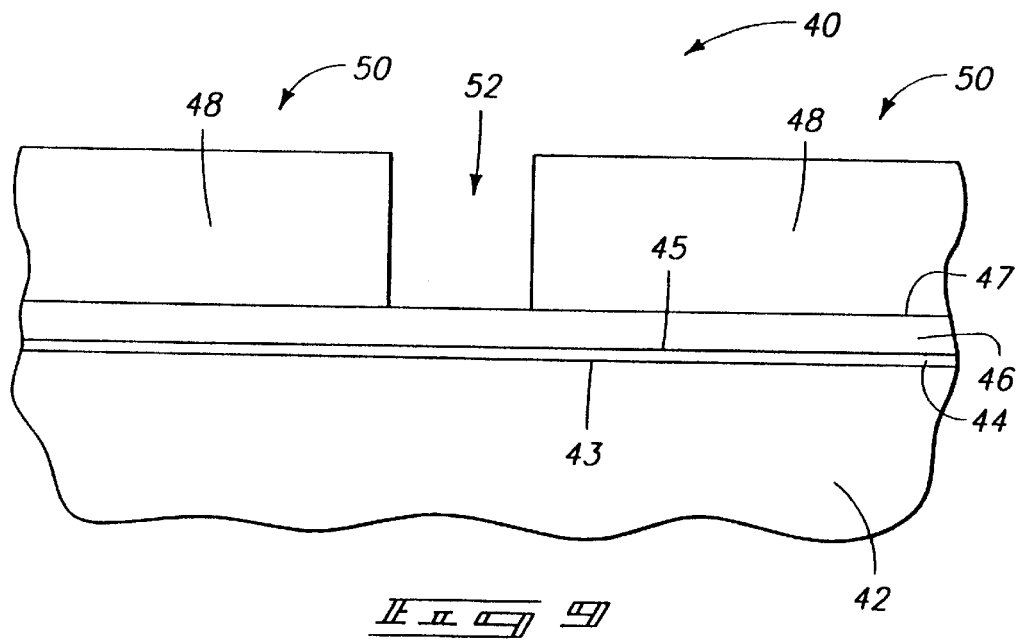
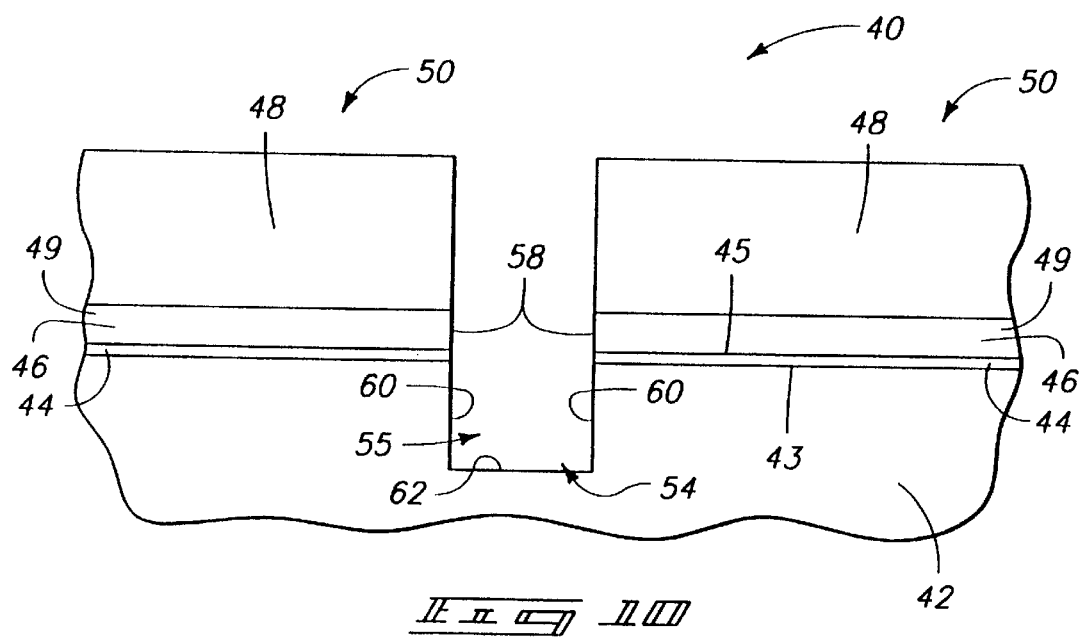

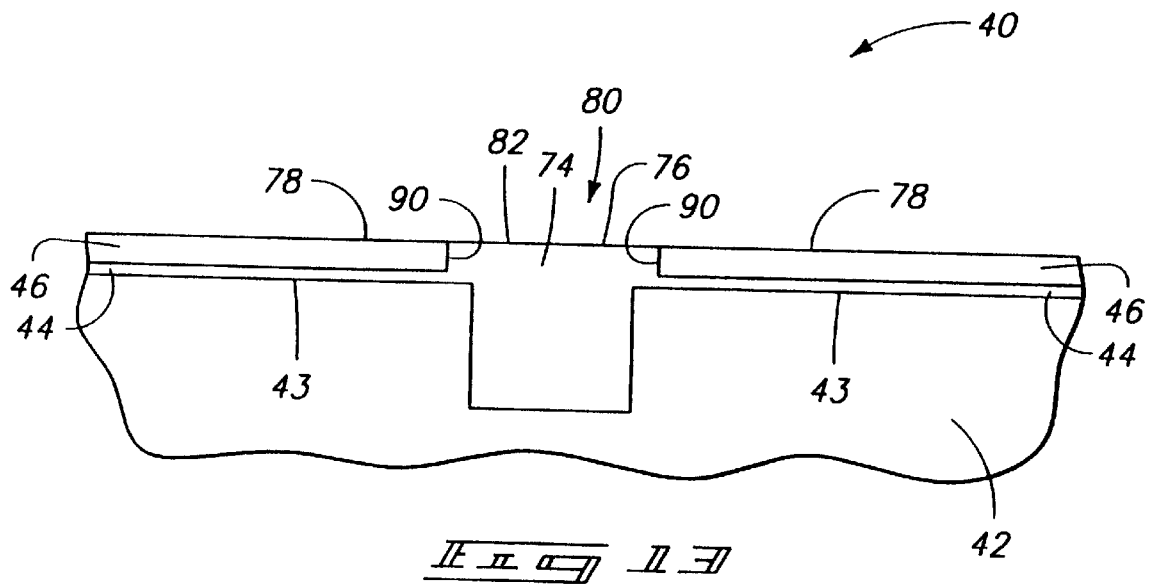
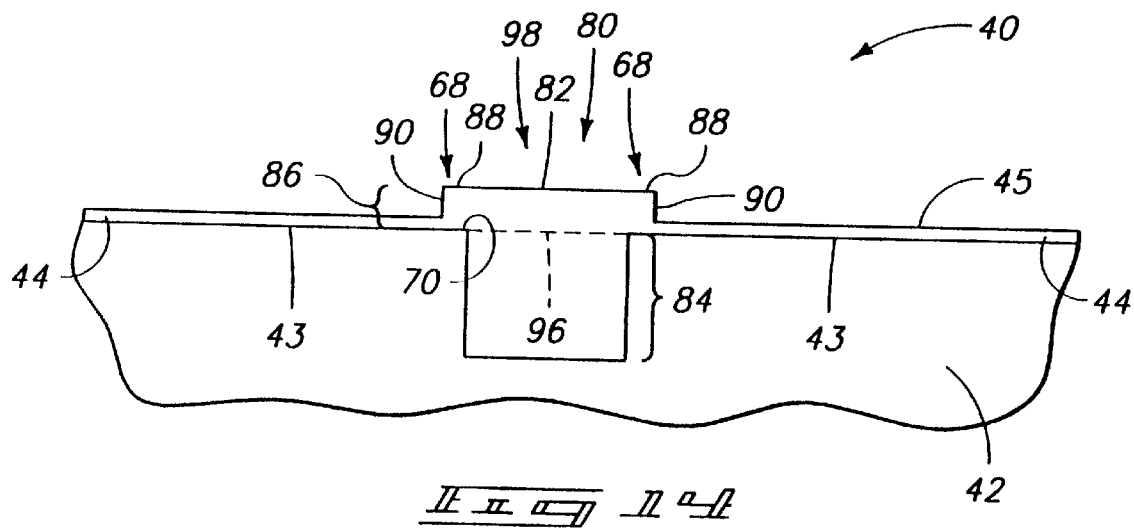

ISOLATION REGIONS AND METHODS OF FORMING ISOLATION REGIONS

RELATED PATENT DATA

This patent resulted from continuation application of U.S. application Ser. No. 08/820,711, filed on Mar. 18, 1997 now U.S. Pat. No. 5,763,932, which is a divisional application of U.S. application Ser. No. 08/745,716, filed on Nov. 12, 1996, now U.S. Pat. No. 5,834,358.

TECHNICAL FIELD

This invention pertains to methods of forming trench isolation regions in semiconductor assemblies, and to trench isolation regions. The invention is thought to have particular significance to shallow trench isolation region technologies.

BACKGROUND OF THE INVENTION

In modern semiconductor device applications, hundreds of individual devices may be packed onto a single small area of a semiconductor substrate, and many of these individual devices may need to be electrically isolated from one another. One method of accomplishing such isolation is to form a trenched isolation region between adjacent devices. Such trenched isolation region will generally comprise a trench or cavity formed within the substrate and filled with an insulative material, such as silicon dioxide.

Trench isolation regions are commonly divided into three categories: shallow trenches (trenches less than about 1 micron deep); moderate depth trenches (trenches of from about 1 to about 3 microns deep); and deep trenches (trenches greater than about 3 microns deep).

Prior art methods for forming trench structures are described with reference to FIGS. 1–7. Referring to FIG. 1, a semiconductor wafer fragment 10 is shown at a preliminary stage of a prior art processing sequence. Wafer fragment 10 comprises a semiconductive material 12 upon which is formed a layer of oxide 14, a layer of nitride 16, and a patterned layer of photoresist 18. Nitride layer 16 comprises an upper surface 17, upon which photoresist layer 18 is supported. Semiconductive material 12 commonly comprises monocrystalline silicon which is lightly doped with a conductivity enhancing dopant.

Referring to FIG. 2, patterned photoresist layer 18 is used as a mask for an etching process. During the etch, unmasked portions of nitride layer 16, oxide layer 14, and semiconductive material 12 are removed to form a trench 20 extending within the semiconductive material 12. Trench 20 has a periphery defined by a trench surface 22 of semiconductive material 12.

Referring to FIG. 3, photoresist layer 18 is removed. Subsequently, an oxide fill layer 24 is formed over nitride layer 16 and within trench 20.

Referring next to FIG. 4, layer 24 is removed, generally by an abrasion technique chemical-mechanical polishing (CMP), down to about upper surface 17 of nitride layer 16. Such polishing forms an oxide plug 26 within the semiconductor material 12, with oxide plug 26 having an upper surface 28 substantially co-extensive with upper surface 17 of nitride layer 16. Plug 26 also comprises sidewalls 33 and upper corners 34 where sidewalls 33 join upper surface 28. Ideally, upper surface 28 would be planarized during the above-discussed polishing of layer 24, and would therefore comprise a flat surface. Also ideally, corners 34 would comprise about a 90° angle, and would therefore be substantially square. However, due to practical limitations of polishing processes, surface 28 is generally, and undesirably, downwardly concave instead of flat, and corners 34 are undesirably substantially less than 90°, as shown. Prior art techniques have been developed to avoid such concavity and non-square corners.

One such prior art technique is discussed with reference to FIGS. 5–7. Referring first to FIG. 5, a prior art processing step subsequent to FIG. 2 is illustrated. Like numerals from the FIG. 3 and 4 embodiment are utilized where appropriate, with differences being indicated by the suffix "a" or with different numerals. As with the above-discussed process of FIG. 3, oxide fill layer 24 is formed over nitride layer 16 and within trench 20. However, unlike the FIG. 3 processing step, a patterned photoresist block 30 is provided over strench 20 through an additional masking step not utilized in the FIG. 3 process.

Subsequently, as shown in FIG. 6, a portion of oxide layer 24 is removed to form an elevated step 32 of oxide material beneath the photoresist block 30.

Referring next to FIG. 7, photoresist block 30 is removed and oxide layer 24 subsequently polished. During the polishing, elevated step 32 compensates for the over-polishing which had previously formed a concavity in surface 28. Accordingly, resulting oxide plug 26a has a flat surface 28a and substantially square corners 34a, as shown. Preferably, flat surface 28a is substantially co-extensive with upper surface 17 of nitride layer 16.

After oxide plug 26a is formed, nitride layer 16 is removed to form a trenched isolation region 38. Such is illustrated in FIG. 8. The removal of nitride layer 16 is typically accomplished with a wet etch. Undesirably during such removal of layer 16, corners 34a are recessed to form the shown inwardly concave corners 36. Such recessed corners 36 can undesirably allow current leakage past the field isolation region 38, thereby substantially diminishing the effectiveness of isolation region 38 for electrically isolating adjacent devices.

For the above-described reasons, it is desirable to develop an improved process of forming a field isolation region, and to thereby form an improved field isolation region construction. Also, it would be desirable to develop a method of forming a field isolation region with a substantially flat upper surface, without the requirement of the extra masking step required to form photoresist block 30 of FIG. 5.

SUMMARY OF THE INVENTION

This invention pertains to methods of forming field isolation regions, and to field isolation regions formed by such methods. In one aspect, the invention comprises the utilization of a silicon-comprising layer adjacent a trench during planarization of an oxide fill within the trench. In another aspect, the invention comprises the formation of an over-hanging oxide sidewall along a lateral edge of a trenched isolation region, the overhanging oxide sidewall overlapping an upper surface of a substrate adjacent the trenched isolation region. In yet another aspect, the invention comprises an oxide plug in a substrate, the plug comprising a recessed portion below a substrate upper surface and an elevated portion above the substrate upper surface. The elevated portion comprising a ledge which extends over the substrate upper surface and has a top surface and a substantially vertical lateral edge side surface. In yet another aspect of the invention, the invention comprises an oxide plug within a substrate, the oxide plug having a recessed portion below the substrate upper surface and an elevated portion above the substrate upper surface, the elevated portion comprising a ledge extending over the substrate upper surface and abutting a polysilicon layer.

BRIEF DESCRIPTION OF THE DRAWINGS

Preferred embodiments of the invention are described below with reference to the following accompanying drawings.

FIG. 9 is a schematic, fragmentary cross-sectional view of a semiconductor wafer fragment in process according to a method of the present invention.

FIG. 10 shows the FIG. 9 wafer at a processing step subsequent to that of FIG. 9.

FIG. 13 shows the FIG. 9 wafer at a processing step subsequent to that of FIG. 12.

FIG. 14 shows the FIG. 9 wafer at a processing step subsequent to that of FIG. 13.

DESCRIPTION OF SPECIFIC EMBODIMENTS

Figure 1:
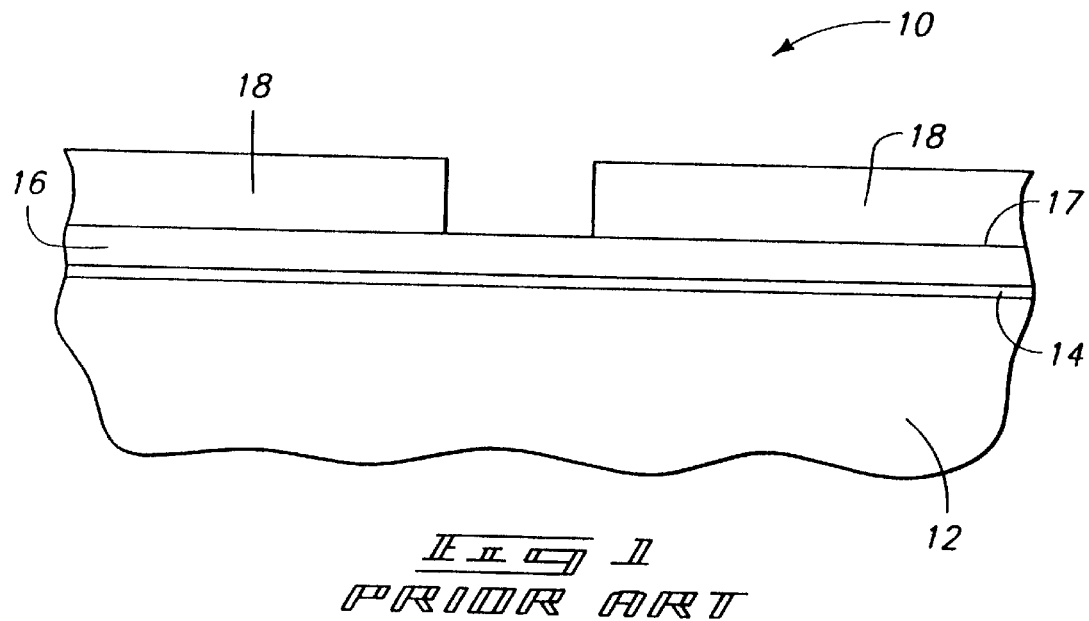
FIG. 1 is a schematic cross-sectional, fragmentary view of a semiconductor wafer fragment at one processing step in accordance with a prior art processing sequence.
Figure 2:
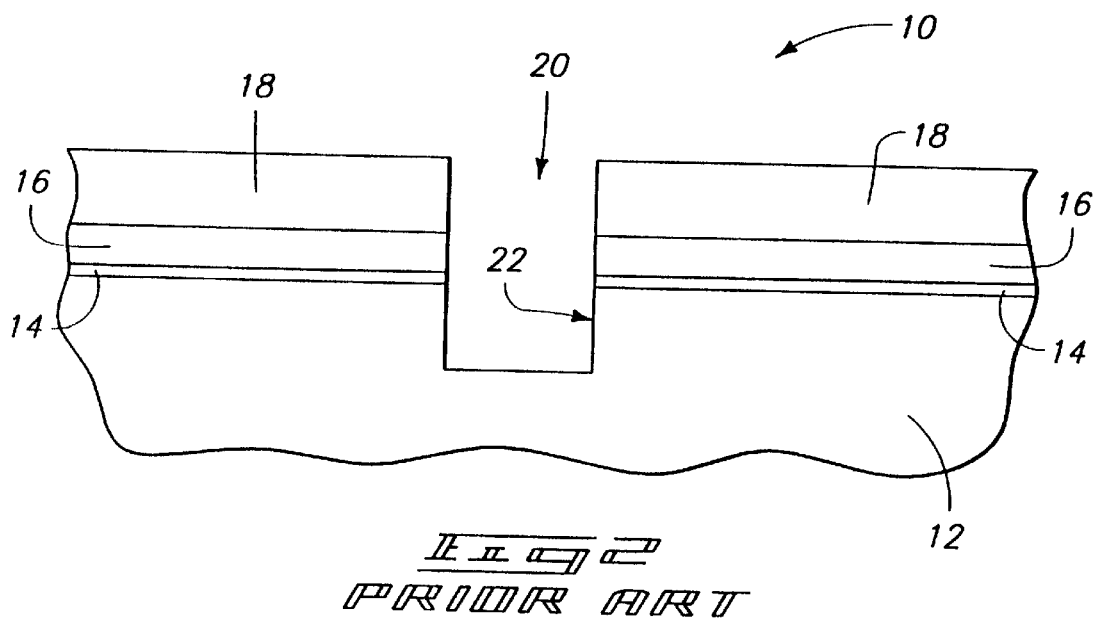
FIG. 2 shows the FIG. 1 wafer at a prior art processing step subsequent to that of FIG. 1.
Figure 3:
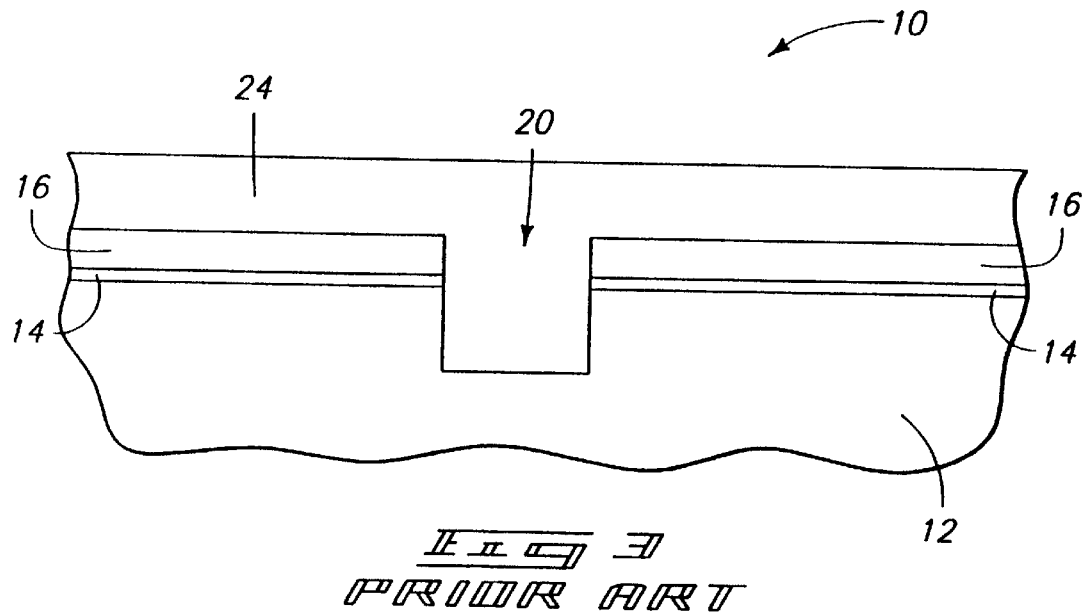
FIG. 3 shows the FIG. 1 wafer at a processing step subsequent to that of FIG. 2 in accordance with a first prior art processing sequence.
Figure 4:
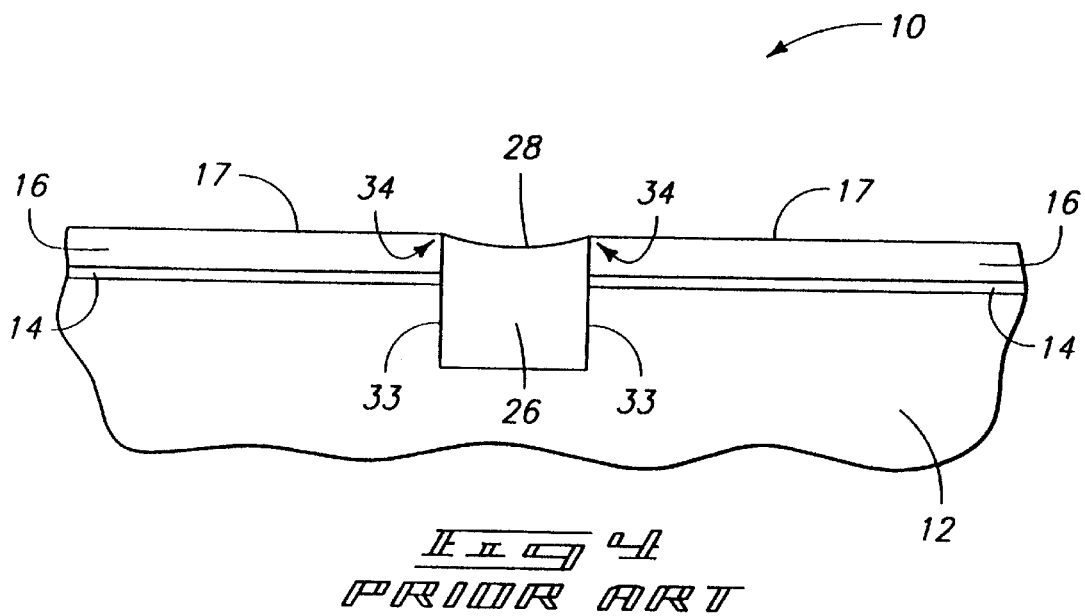
FIG. 4 shows the FIG. 3 wafer at a prior art processing step subsequent to that of FIG. 3.
Figure 5:
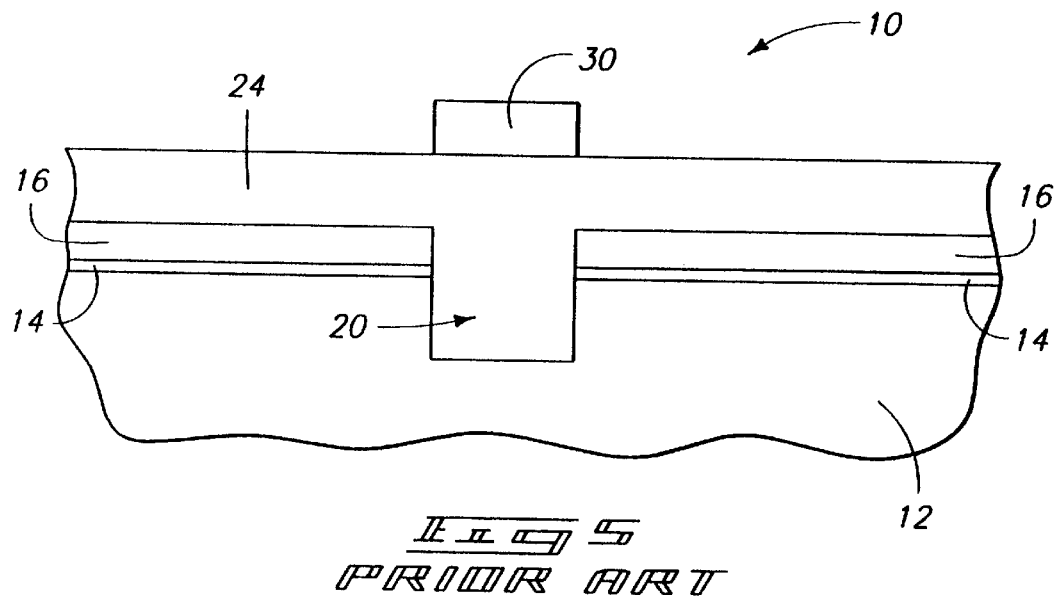
FIG. 5 shows the FIG. 1 wafer at a processing step subsequent to that of FIG. 2 in accordance with a second prior art processing sequence.
Figure 6:
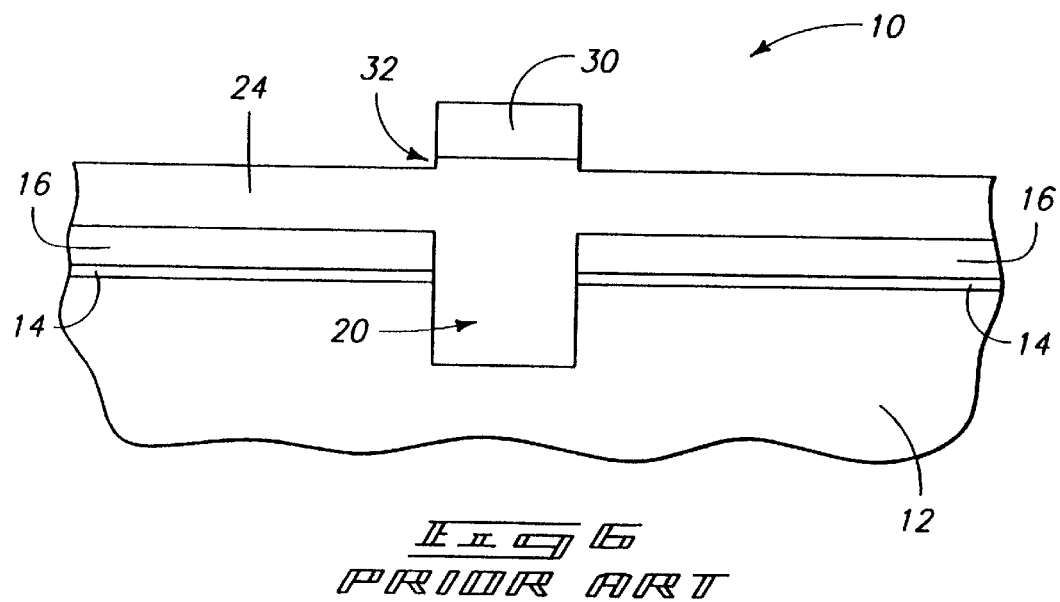
FIG. 6 shows the FIG. 1 wafer at a prior art processing step subsequent to that of FIG. 5.

This disclosure of the invention is submitted in furtherance of the constitutional purposes of the U.S. Patent Laws "to promote the progress of science and useful arts" (Article 1, Section 8).

The invention disclosed herein pertains generally to field isolation regions and to methods of forming field isolation regions. The invention is thought to have particular significance to shallow trench isolation regions, but is not intended to be limited to shallow trench isolation regions.

A couple of definitions that are utilized in the context of this document pertain to the terms "semiconductor substrate" and "substrate". The term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Exemplary embodiments of the invention are described with reference to FIGS. 9–14.

Referring to FIG. 9, a semiconductor wafer fragment 40 processed according to a method of the present invention is illustrated. Processed wafer fragment 40 comprises the following layers in the shown elevationally ascending order: a semiconductive material 42, a buffer layer 44, a polishing material layer 46, and a patterned photoresist a layer 48. Material 42 has an upper surface 43 upon which buffer layer 44 is formed, buffer layer 44 has an upper surface 45 upon which polishing material layer 46 is formed, and polishing material layer 46 has an upper surface 47 upon which photoresist layer 48 is formed.

Preferably, semiconductive material layer 42 will comprise mono-crystalline silicon, and most preferably comprise such silicon doped with a conductivity enhancing dopant to a concentration of from about $5\times10^{15}$ atoms/cm$^3$ to about $1\times10^{16}$ atoms/cm$^3$.

Buffer layer 44 preferably comprises an oxide, and is preferably from about 20 to about 500 Angstroms thick. Methods of forming such oxide layers are known to persons of skill in the art, and include growing the oxide on a silicon wafer 42 or depositing oxide from the decomposition of tetra-ethyl-ortho-silicate (TEOS). An example method of growing gate oxide is by wet oxidation at a temperature of about 800° C. in an atmosphere of $O_2$ for about 30 minutes. An example method of depositing by TEOS decomposition is by Low-Pressure Chemical Vapor Deposition (LPCVD), as is known by persons of skill in the art.

Polishing material 46 will preferably comprise silicon, either amorphous silicon or polysilicon, with a thickness of from about 200 Angstroms to about 3000 Angstroms. Methods of forming such silicon layers are known to persons of skill in the art, and include such methods as LPCVD at a temperature of from 500° C. to about 650° C. utilizing $SiH_4$. Preferably, polishing material layer 46 will comprise silicon doped to a concentration of from about $1\times10^{19}$ atoms/cm$^3$ to about $1\times10^{21}$ atoms/cm$^3$ with either an n-type or p-type dopant. The polishing material may be formed as a doped layer, or alternatively, may be doped after formation. An example and preferred method is to form a doped layer by incorporating $PH_3$ into the $SiH_4$ LPCVD method described above. In alternative embodiments of the invention recited in the claims which follow, layer 46 may alternatively be referred to as a first layer, a silicon-comprising layer, or an oxidizable layer.

Doping of a silicon layer generally increases the rate at which the layer is polished. Thus, the polishing rate of a silicon layer can be adjusted by altering the dopant concentration within the layer. Most preferably, for reasons discussed below, layer 46 will comprise silicon appropriately doped to polish at a rate substantially equal to the rate at which an oxide layer polishes under the same conditions.

Patterned photoresist layer 48 is utilized as a masking layer in subsequent processing steps. Photoresist layer 48 covers only a portion of polishing layer 46 and thus forms a masked portion 50 and an unmasked portion 52 of the polishing layer.

Referring next to FIG. 10, a trench 54 is formed through layers 44 and 46, and within material 42. Such trench 54 may be formed by removing unmasked portion 52 of polishing material layer 46 (shown in FIG. 9) to expose a portion of buffer layer 44, removing the exposed portion of buffer layer 44 to expose a portion of semiconductive material 42, and removing some of the exposed portion of semiconductive material 42. The removal of layers 44, 46 and material 42 is preferably accomplished with a reactive ion etch process. Such reactive ion etch process most preferably comprises 1) etching a polysilicon layer 46 with $Cl_2/HeO_2$; 2) etching an oxide 44 with $CF_4/CHF_3$; and 3) etching a silicon substrate 42 with $NF_3$. After the reactive etching, polishing layer 46 comprises segments 49 adjacent trench 54. Segments 49 comprise lateral surfaces 58 substantially coextensive with the lateral portions 60 of trench 54.

Trench 54 has an interior 55, and a periphery surrounding interior 55. The periphery is defined by a trench surface comprising lateral portions 60 and a bottom portion 62 of exposed material 42. For purposes of the following discussion, trench 54 may also be referred to as a cavity or opening.

Figure 11:
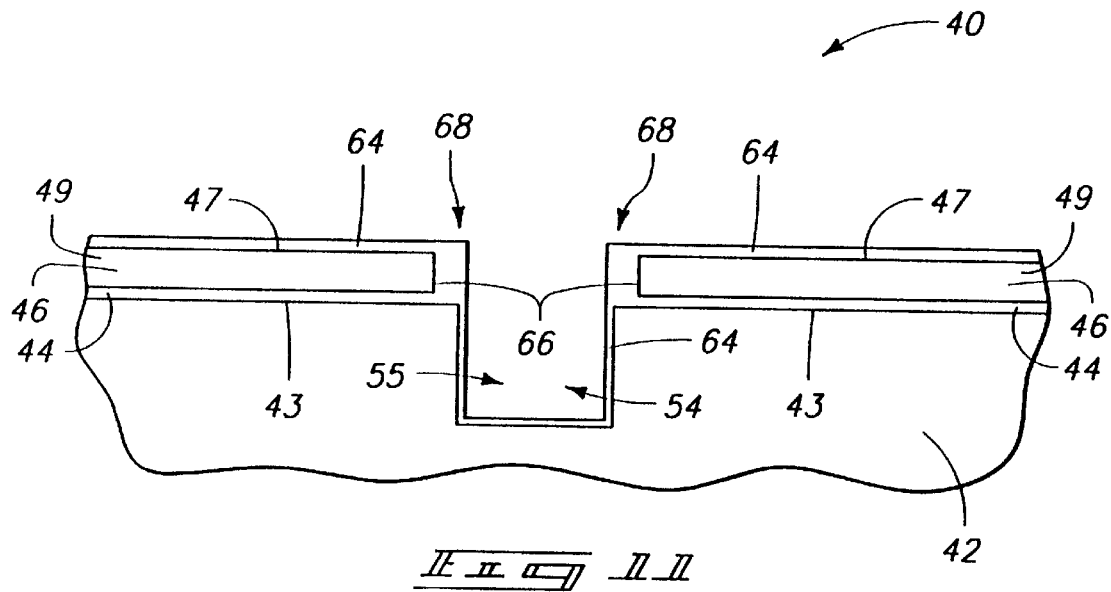
FIG. 11 shows the FIG. 9 wafer at a processing step subsequent to that of FIG. 10.

Referring to FIG. 11, patterned photoresist layer 48 is removed. Subsequently, an oxide layer 64 is formed within trench 54. Preferably, layer 64 also extends over upper surface 47 and along lateral surfaces 58 (shown in FIG. 10) of the preferred silicon-comprising polishing layer 46. As shown, the formation oxide layer 64 most preferably causes lateral edges 58 (shown in FIG. 10) to be displaced laterally outward and away from interior 55 of trench 54 to form recessed lateral edges 66. A method of accomplishing such lateral displacement of the lateral edges is to dope the preferable silicon-comprising layer 46 more heavily than the silicon-comprising material 42 prior to oxidation. Such relative dopant concentrations in layer 46 and material 42 will cause layer 46 to oxidize at a preferred faster rate than material 42. Example dopant concentrations for material 42 and layer 46 are described above. An example process for oxidizing material 42 and layer 46 is a wet oxidation process in which substrate 40 is exposed to $O_2$ at a temperature of from about 800° C. to about 950° C. for about 30 minutes.

After the oxidation, an oxide ledge 68 is formed abutting recessed lateral edges 66 and overlapping a portion of upper surface 43 adjacent trench 54. Thus, in the shown preferred embodiment in which buffer 44 is an oxide, oxide layer 44 and oxide layer 64 combine to form overhanging oxide sidewall 68 overlapping upper surface 43 of material 42.

Figure 12:
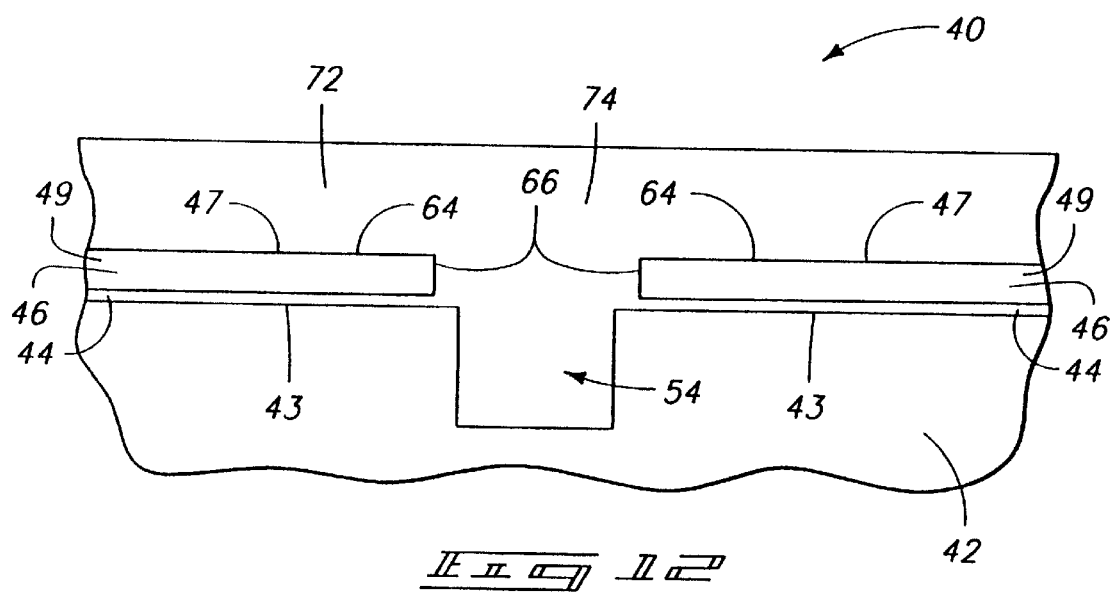
FIG. 12 shows the FIG. 9 wafer at a processing step subsequent to that of FIG. 11.

Referring to FIG. 12, an oxide layer 72 is deposited over polishing material 46 and within trench 54 to effectively fill trench 54. In the shown preferred embodiment, oxide layers 44, 64 and 72 combine to form a combined oxide layer 74 which extends into cavity 54, between material 42 and layer 46, over layer 46, and abuts lateral surfaces 66 of segments 49. An example method for depositing oxide 72 is an LPCVD process utilizing TEOS at from about 600° C. to about 650° C. for about two hours.

Oxide layer 74 is preferably subjected to a densification anneal. Example conditions include exposure to a temperature of from about 1000° C. to about 1100° C. for from about 30 minutes to about 60 minutes under an atmosphere of $N_2$ or Ar.

Referring to FIG. 13, a portion of oxide layer 74 is removed. Preferably, such removal is accomplished by abrasively polishing the oxide, and most preferably by a process which provides a planarized upper surface 76 of the remaining oxide, such as by chemical-mechanical planarization. Also preferably, the removal of oxide layer 74 will be to at least upper surface 47 (shown in FIG. 9) of polishing material layer 46, and most preferably will extend to below upper surface 47. Thus, most preferably a portion of layer 46 is removed during the polishing step to form a second upper surface 78 of layer 46, with second upper surface 78 being elevationally below the level of first upper surface 47.

As discussed above, layer 46 preferably comprises a doped silicon-comprising layer. By adjusting the dopant concentration, it is possible to adjust the rate at which layer 46 is polished. Most preferably, the dopant level within silicon-comprising layer 46 is adjusted such that layer 46 will polish (i.e. be removed under polishing conditions) at about the same rate as the rate at which oxide 74 polishes. Under polishing conditions of 5–7 PSI at from about 100 to about 400 feet/minute, layer 74 polishes at a rate of from about 1500 Angstroms/minute to about 3000 Angstroms/minute. It has been found that a layer of silicon doped to a level of from about $1 \times 10^{19}$ atoms/cm$^3$ to about $1 \times 10^{21}$ atoms/cm$^3$ with an n-type or p-type dopant will etch at a rate of from about 1000 Angstroms/minute to about 2500 Angstroms/minute, which is considered to be substantially equivalent to the rate at which layer 74 polishes.

After the above-discussed polishing, the remaining oxide 74 forms an isolating oxide plug 80 comprising a substantially planar outer surface 82.

Figure 7:
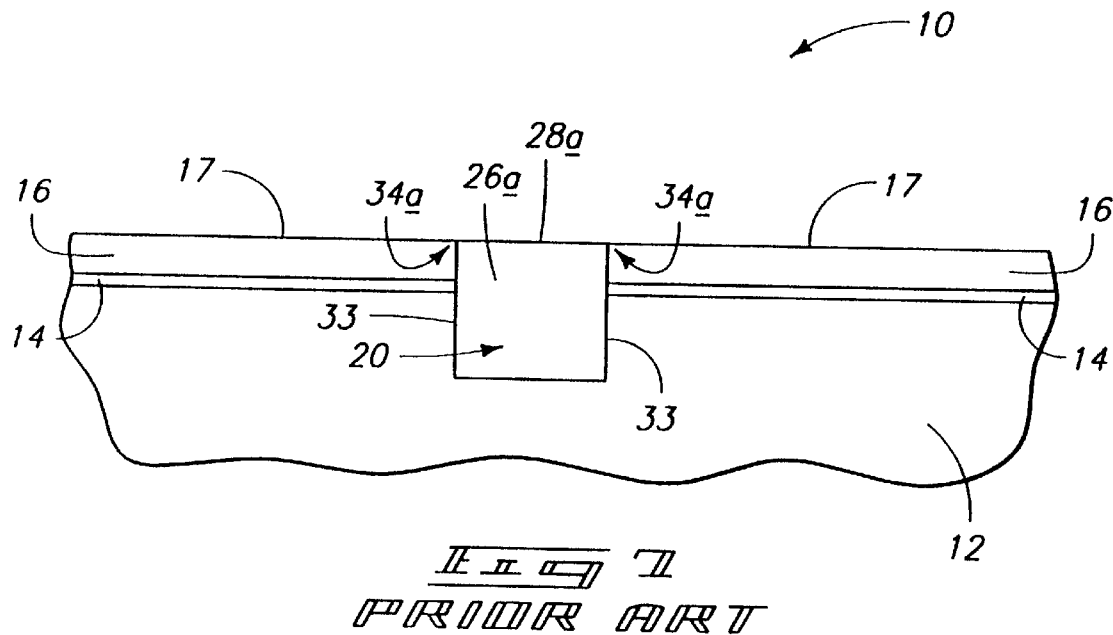
FIG. 7 shows the FIG. 1 wafer fragment at a prior art processing step subsequent to that of FIG. 6.
Figure 8:
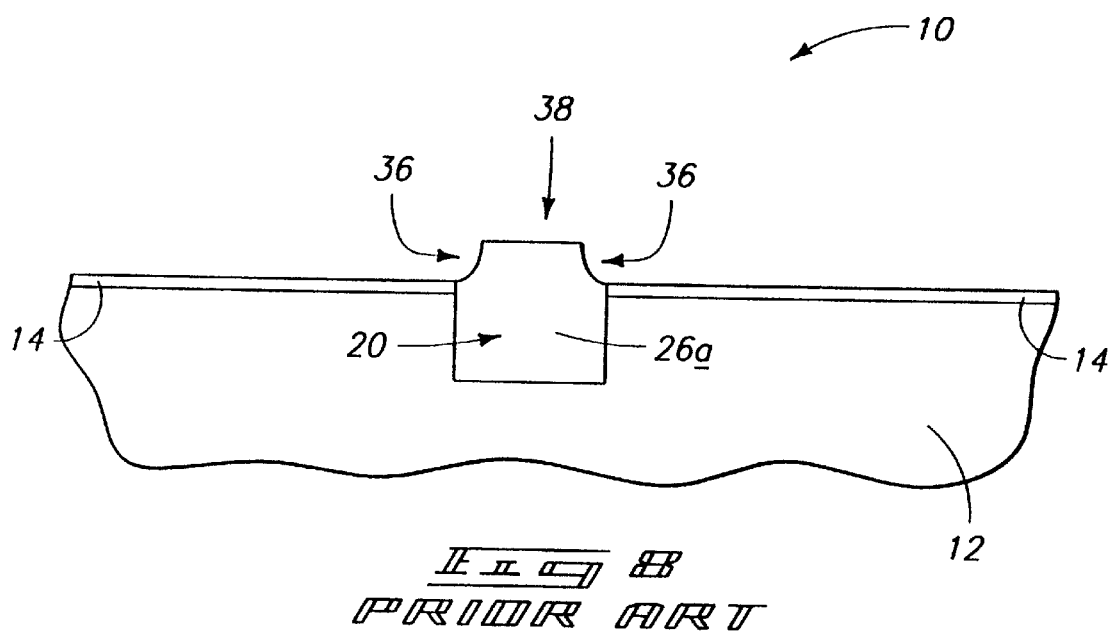
FIG. 8 shows the FIG. 1 wafer fragment at a prior art processing step subsequent to that of FIG. 7.

The present invention process of polishing layer 46 and oxide 74 at a substantially equivalent rate can substantially avoid the undesired recessed corners 36 of the prior art polishing process shown in FIG. 8. In light of the present invention, a significant contribution to the recessed corner formation of the prior art processing is that a nitride layer (such as layer 16 in FIG. 7) does not polish at about the same rate as silicon dioxide.

Referring next to FIG. 14, polishing layer 46 is removed, leaving oxide isolation region 80. In the preferred embodiment in which layer 46 comprises silicon, the polishing layer 46 is preferably removed by a wet etch process selective for silicon relative to oxide. Such a wet etch process may comprise, for example, $HNO_3/H_2O$ at about 30° C.

The resulting structure in FIG. 14 is an oxide plug 80 comprising a recessed portion 84 elevationally below an adjacent portion of substrate upper surface 43 and an elevated portion 86 elevationally above the adjacent portion of upper surface 43. Elevated portion 86 comprises ledge 68 extending over surface 43. Ledge 68 comprises a top surface 88 and a substantially vertical lateral edge side surface 90 extending from top surface 88 to upper surface 45 of buffer 44. Preferably, ledge 68 will extend laterally over surface 43 by from about 200 Angstroms to about 500 Angstroms. Also preferably, ledge 68 will extend to a height of from about 200 Angstroms to about 3000 Angstroms above surface 43.

Alternatively described, oxide plug 80 may be considered a recessed trench isolation oxide assembly wherein the recessed portion 84 is a recessed isolation oxide and the elevated portion 86 is an oxide cap over the recessed isolation oxide. Recessed isolation oxide 84 comprises an upper edge 96 (shown as a dashed line). Upper edge 96 defines an upper terminus of recessed isolation oxide 84 and is elevationally substantially co-extensive with a portion of upper surface 43 adjacent plug 80. Oxide cap 86 extends over upper edge 96 and overlaps a portion of upper surface 43 adjacent plug 80. In the preferred embodiment in which buffer layer 44 is an oxide layer, oxide cap 86 comprises buffer layer 44, and, unless it is expressly stated otherwise, is defined to comprise a portion of buffer layer 44 extending beyond vertical sidewalls 90. Alternatively, recessed trench isolation oxide cap 86 may be referred to as a truncated oxide cap. A truncated oxide cap is defined to have a lateral periphery truncated by vertical sidewalls 90. Accordingly, the portion of layer 44 extending laterally beyond sidewalls 90 is not part of the truncated oxide cap. Rather, the truncated oxide cap will only include the portion of layer 44 beneath outer surface 82 of oxide plug 80. Also, it is noted that in embodiments in which layer 44 is not oxide, layer 44 is not included in either an oxide cap or a truncated oxide cap.

Although the recessed trench isolation assembly is described with reference to FIG. 14, it is to be understood that the assembly also exists in the intermediate step of FIG. 13, with vertical sidewalls 90 abutting polishing layer 46.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An oxide plug in a silicon wafer substrate, the substrate having an upper surface, the plug comprising:
   a recessed portion elevationally below the substrate upper surface; and
   an elevated portion above the substrate upper surface, the elevated portion comprising an extension extending across a portion of the substrate upper surface, the extension comprising a substantially vertical lateral edge side surface.

2. An oxide plug assembly in and above a silicon-comprising substrate upper surface, the assembly comprising:
   a polysilicon layer over the silicon-comprising substrate upper surface, the polysilicon layer having a lateral edge side surface; and
   an oxide plug comprising:
      a recessed portion elevationally below the substrate upper surface; and
      an elevated portion above the substrate upper surface, the elevated portion comprising an extension extending over and along the substrate upper surface, the extension comprising a lateral edge side surface, the oxide plug lateral edge side surface being in physical contact with the lateral edge side surface of the polysilicon layer.

3. A recessed trench isolation assembly comprising:
   a recessed trench isolation oxide assembly within a semiconductor substrate, the trench isolation oxide assembly comprising a recessed isolation oxide having an upper edge, the upper edge being defined as an upper terminus of the recessed isolation oxide elevationally substantially coextensive with an adjacent upper surface of the semiconductor substrate;
   the recessed trench isolation oxide assembly comprising an oxide cap over the recessed isolation oxide, the oxide cap extending over the upper edge of the recessed isolation oxide and overlapping the adjacent upper surface of the substrate, the oxide cap having a lateral edge side surface which is on the upper surface of the substrate; and
   a polysilicon layer over the substrate, the polysilicon layer having a lateral edge side surface, the lateral edge side surface of the oxide cap being in physical contact with the lateral edge side surface of the polysilicon layer.

4. A recessed trench isolation assembly comprising:
   a recessed trench isolation oxide assembly within a semiconductor substrate, the trench isolation oxide assembly comprising a recessed isolation oxide having an upper edge, the upper edge being defined as an upper terminus of the recessed isolation oxide elevationally substantially coextensive with an adjacent upper surface of the semiconductor substrate;
   the recessed trench isolation oxide assembly comprising an oxide cap over the recessed isolation oxide, the oxide cap extending over the upper edge of the recessed isolation oxide and overlapping the adjacent upper surface of the substrate the oxide cap being a truncated oxide cap; and
   a polysilicon layer over the substrate and in physical contact with the truncated oxide cap.

5. A recessed trench isolation oxide assembly comprising:
   a recessed trench isolation oxide assembly within a semiconductor substrate, the trench isolation oxide assembly comprising a recessed isolation oxide having an upper edge, the upper edge being defined as an upper terminus of the recessed isolation oxide elevationally substantially coextensive with an adjacent upper surface of the semiconductor substrate;
   the recessed trench isolation oxide assembly comprising an oxide cap over the recessed isolation oxide, the oxide cap extending over the upper edge of the recessed isolation oxide and overlapping the adjacent upper surface of the substrate, the oxide cap having a lateral edge side surface which is on the upper surface of the substrate;
   an oxide-comprising pad layer over the substrate; and
   a doped polysilicon layer over the oxide pad layer, the polysilicon layer having a lateral edge side surface, the lateral edge side surface of the oxide cap physically contacting the lateral edge side surface of the polysilicon layer.

6. A recessed trench isolation oxide assembly comprising:
   a recessed trench isolation oxide assembly within a semiconductor substrate, the trench isolation oxide assembly comprising a recessed isolation oxide having an upper edge, the upper edge being defined as an upper terminus of the recessed isolation oxide elevationally substantially coextensive with an adjacent upper surface of the semiconductor substrate;
   the recessed trench isolation oxide assembly comprising an oxide cap over the recessed isolation oxide, the oxide cap extending over the upper edge of the recessed isolation oxide and overlapping the adjacent upper surface of the substrate, the oxide cap being a truncated oxide cap;
   an oxide-comprising pad layer over the substrate; and
   a doped polysilicon layer over the oxide pad layer and in physical contact with the oxide cap.

* * * * *

UNITED STATES PATENT AND TRADEMARK OFFICE
CERTIFICATE OF CORRECTION

PATENT NO. : 6,093,953
DATED : July 25, 2000
INVENTOR(S) : Pai-Hung Pan; Karl M. Robinson It is certified that error appears in the above-identified patent and that said Letters Patent are hereby corrected as shown below:

Col. 2, line 15   Replace "strench" with --trench--

Signed and Sealed this

First Day of May, 2001

Attest:

NICHOLAS P. GODICI

Attesting Officer    Acting Director of the United States Patent and Trademark Office